April 16, 1968 V. J. POEHLS 3,378,730

PRINTED CIRCUIT BOARD ASSEMBLY WITH RELEASABLE SECURING AND ENGAGING MEANS

Filed Sept. 1, 1966 2 Sheets-Sheet 1

Vernon J. Poehls,
*INVENTOR.*

*Harry M. Saragovitz*
BY *Edward J. Kelly*
*Herbert Berl*
*Harold W. Hilton*

Vernon J. Poehls,
INVENTOR.
BY Harry M. Saragovitz
Edward J. Kelly
Herbert Berl
Harold W. Hilton United States Patent Office 3,378,730

Patented Apr. 16, 1968

3,378,730

PRINTED CIRCUIT BOARD ASSEMBLY WITH RELEASABLE SECURING AND ENGAGING MEANS

Vernon J. Poehls, El Cajon, Calif., assignor, by mesne assignments, to the United States of America as represented by the Secretary of the Army Filed Sept. 1, 1966, Ser. No. 577,113
7 Claims. (Cl. 317—101)

ABSTRACT OF THE DISCLOSURE

A printed circuit board interconnection apparatus including a plurality of mutually perpendicular intersecting printed circuit boards having conductors mounted thereon in correspondingly spaced relation. A connector member is mounted on each board, on the side opposite the conductors, and extends through the boards for contact with the conductors of the boards. A securing member is mounted on the edges of both boards at the position of intersection of the boards for retention of the boards in the mutually perpendicular intersecting relationship.

Some attempts have been made to package circuits in three dimensional assemblies wherein the boards are mutually perpendicular and are interconnected by insertion into slots provided in the boards. However, such structure limits the spacing between the boards to the distance between the slots.

It is an object of the present invention, therefore, to provide a three dimensional printed wiring assembly in which the wiring is printed on first and second groups of intersecting mutually perpendicular boards with connections between the boards being effected at the intersections thereof.

A further object of the present invention is to provide such a three dimensional printed wiring assembly with means for assembling the boards without imposing limitations on the extent of spacing of the boards.

Still another object of the present invention is to provide a three dimensional printed wiring assembly having no soldered connections between the boards.

In carrying out these objects as is illustrated in the embodiments of the invention herein disclosed, a three dimensional arrangement of intersecting mutually perpendicular printed wiring boards is employed. A plurality of continuous (long) boards are arranged in substantially parallel relation and a plurality of sectioned (short) boards are arranged in substantially parallel relation and perpendicular to the continuous boards. Circuit patterns conforming to the requirements of the particular machine are printed on the boards in each group before assembly and, where interconnections between the circuits on a continuous board and a sectioned board are required to be made, the circuit patterns are printed so that when assembled the conductors to be connected are adjacent the intersection of the boards. A plug in type of connector is connected to the conductors of one of the group of boards and a second mating connector is secured to the conductors of the second group of boards. A plurality of edge mounting clips engage the respective boards for interconnection thereof. Thus, the boards can be readily assembled and disassembled without the necessity of solder connections between the conductors.

The manner in which all the advantages of the present invention are achieved may be understood from the following description taken in conjunction with the accompanying drawings, in which:

FIGURE 2 is a view of a mating plug in connector for the connector shown in FIGURE 2.

Figure 1:
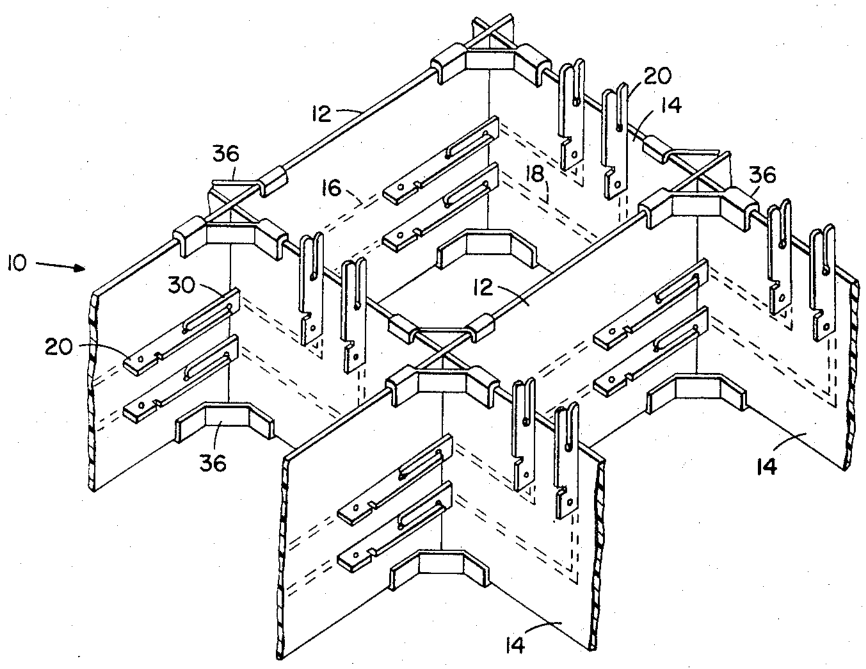
FIGURE 1 is a perspective view of the three dimensional wiring lattice of the present invention.

As shown in FIGURE 1, the three dimensional wiring lattice is generally designated by the numeral 10. The wiring lattice includes a first plurality of continuous boards 12 disposed in spaced parallel relation and a second plurality of shorter boards 14. Both groups of boards have a plurality of conductors 16 and 18 respectively printed on one side thereof.

Figure 2:
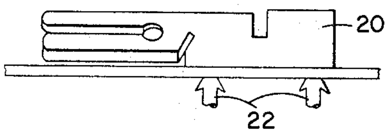
FIGURE 2 is a view of one of the plug in connectors used in the present invention.
Figure 3:
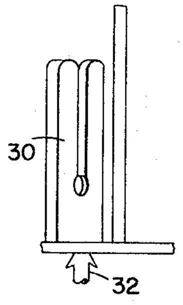
Figure 5:
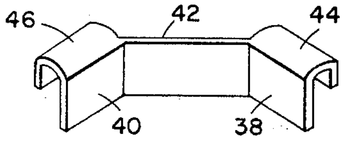
FIGURE 5 is a view of the clip which engages the boards to retain them in operative position.

On boards 12, on the side opposite the conductors, a contact member 20 is mounted. Member 20 includes an element 22 which extends through board 12 to engage the conductors (FIG. 2). Member 20 is mounted on boards 12 adjacent the point of interconnection with boards 14. Boards 14 are substantially shorter than boards 12 and have mounted thereon, on the side opposite conductors 18, a plurality of connector members 30. Members 30 include an element 32 which extends through the boards in engagement with conductors 18. Members 30 are disposed for mating engagement with members 20. Also, as shown in FIGURE 1, members 20 may be mounted at the edges of boards 14 to permit external connections to the boards. A plurality of clips 36 engage each of the boards adjacent the intersection thereof to retain them in place. As shown in FIGURE 1, clips 36 are disposed for releasable attachment of boards 14 at preselected positions along boards 12 intermediate or adjacent the ends thereof. As shown in FIGURE 5, the clips include a pair of end portions 38 and 40 which are disposed in normal relation. A central portion 42 connects the end portions and is inclined at a 45° angle therebetween making a total of 90° for the clip. A pair of arcuate portions 44 and 46 extend from end portions 38 and 40, respectively, to engage the boards.

To assemble the three dimensional wiring lattice, the boards are moved into place and the connector members of the appropriate boards are mated. Clips 36 are then positioned with arcuate portion 44 over board 12 and arcuate portion 46 over board 14.

It is to be understood that as many continuous boards 12 are placed in parallel as needed and are separated by the required number of sectioned boards 14.

Figure 4:
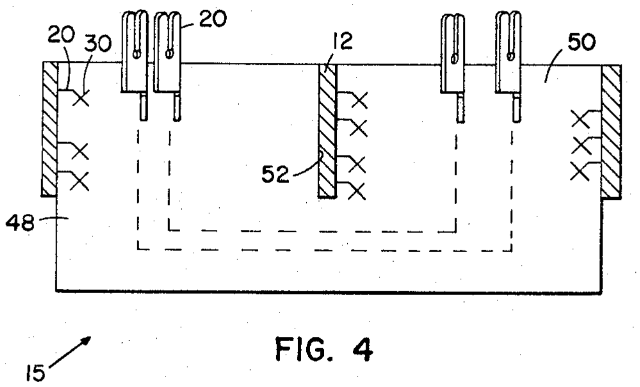
FIGURE 4 is a view of another type of board which may be utilized in the present invention.

As shown in FIGURE 4, an additional type of board may be required to provide connection between the continuous boards 12, this board is generally indicated by the numeral 15 and includes a pair of portions 48 and 50 extending on opposite sides of a continuous board 12 which is mounted in a slot 52 provided in the board. A plurality of connector members 20 are disposed on the edge of the board and on a side opposite the printed conductors. Connection between the conductors 20 and 30 of the respective boards is accomplished in the same manner as described supra. Such connection being diagrammatically shown in FIGURE 4 for clarity.

The invention is not intended to be limited to the embodiments shown and described but, may be capable of many modifications without departing from the spirit and scope of the appended claims.

I claim:

1. A printed circuit package comprising a solderless assembly of first and second groups of mutually perpendicular intersecting printed circuit boards and conductors mounted on said boards in correspondingly spaced relationships; a first plurality of connector members releasably mounted on said first group of boards in engagement with said conductors thereof, said first plurality of connector members being mounted on said first groups of boards at preselected spaced intervals along the length thereof; a second plurality of connector members releasably mounted on said second group of boards in engagement with the conductors thereof, said second group of boards being disposed between said first group of boards in normal relation thereto and having the ends thereof in abutting relationship with the surfaces of said first group of boards, said first connection members including means for releasably engaging said second connector members, said second connector members including means for releasably engaging said first connector members; and means for securing said first and second groups of boards together for mating relationship of said connector members.

2. A printed circuit package as in claim 1 wherein said securing means includes a member mounted on the edges of said groups of boards for retention thereof in assembled position.

3. A printed circuit package as in claim 2 wherein said securing means includes a body having a pair of end portions extending in normal relation and a central portion joining said end portions and inclined at a 45° angle therewith, a pair of arcuate portions each respectively extending from said end portions for engagement with said boards.

4. A printed circuit package as in claim 3 wherein said conductors of said groups of said boards are all positioned on one side of said boards for ease of access thereto, when said boards are in assembled position.

5. A printed circuit package as in claim 4 wherein said connector members are positioned on said boards on the side opposite from the side said conductors are mounted.

6. A printed circuit package as in claim 1 with each board of said second group of boards having a slot therein to receive a board of said first group of boards.

7. A printed circuit package as in claim 1 wherein said first plurality of connector members are disposed on said first groups of boards at selected positions intermediate the ends thereof; and, said securing means is releasably carried by each of said boards so that said boards may be moved relative one to the other for predetermined spacing between said boards.

References Cited

UNITED STATES PATENTS

| | | | |
|---|---|---|---|
| 1,620,737 | 3/1927 | Peterson | 312—140 |
| 1,867,107 | 7/1932 | Schmidt | 312—140 |
| 2,889,493 | 6/1959 | Scal et al. | |
| 2,951,184 | 8/1960 | Wyma. | |
| 3,149,894 | 9/1964 | Fox. | |

OTHER REFERENCES

"Interconnections," Electronic Design, Nov. 9, 1960, p. 90, copy 317-101.

ROBERT K. SCHAEFER, *Primary Examiner.*

D. SMITH, *Assistant Examiner.*